United States Patent
Nordlöf

(10) Patent No.: US 7,629,774 B2
(45) Date of Patent: Dec. 8, 2009

(54) DEVICE FOR REDUCING THE OUTPUT CURRENT OF A BATTERY CHARGER

(75) Inventor: Peter Nordlöf, Avesta (SE)

(73) Assignee: Creator Teknisk Utveckling AB, Vikmanshyttan (SE)

( * ) Notice: Subject to any disclaimer, the term of this patent is extended or adjusted under 35 U.S.C. 154(b) by 544 days.

(21) Appl. No.: 10/505,369

(22) PCT Filed: Feb. 21, 2003

(86) PCT No.: PCT/SE03/00286

§ 371 (c)(1),
(2), (4) Date: May 5, 2005

(87) PCT Pub. No.: WO03/071657

PCT Pub. Date: Aug. 28, 2003

(65) Prior Publication Data

US 2005/0225300 A1    Oct. 13, 2005

(30) Foreign Application Priority Data

Feb. 22, 2002  (SE) .................................... 0200546

(51) Int. Cl.
*H02J 7/16* (2006.01)

(52) U.S. Cl. ...................................... 320/156; 320/141

(58) Field of Classification Search ................ 320/141, 320/140, 143, 156
See application file for complete search history.

(56) References Cited

U.S. PATENT DOCUMENTS 4,146,830 A * 3/1979 Foster ......................... 320/160
5,838,142 A * 11/1998 Wyss et al. .................. 320/148

* cited by examiner

*Primary Examiner*—Edward Tso
*Assistant Examiner*—Aaron Piggush
(74) *Attorney, Agent, or Firm*—Young & Thompson

(57) ABSTRACT

A device for reducing the output current of a primary switched battery charger, which charger includes an input DC power circuit, a high frequency transformer and control unit for modulating the DC input power. The device includes elements for measuring pulse ratio of switch pulses on the output side of the charger, elements for measuring peak value of output voltage, elements for differentially amplifying the signals measured and elements for integrating voltage/current of the differentially amplified signals, wherein the integrated voltage/current is used for modulating the input DC power in order to reduce the output current. The device includes elements for measuring the output effect of the charger, elements for measuring the output voltage of the charger, elements for dividing the signals measured and elements for multiplexing voltage/current of the output from the elements for dividing, wherein the multiplexed voltage/current is used for modulating the input DC power in order to reduce the output current.

5 Claims, 4 Drawing Sheets

DEVICE FOR REDUCING THE OUTPUT CURRENT OF A BATTERY CHARGER

TECHNICAL AREA

Figure 1:
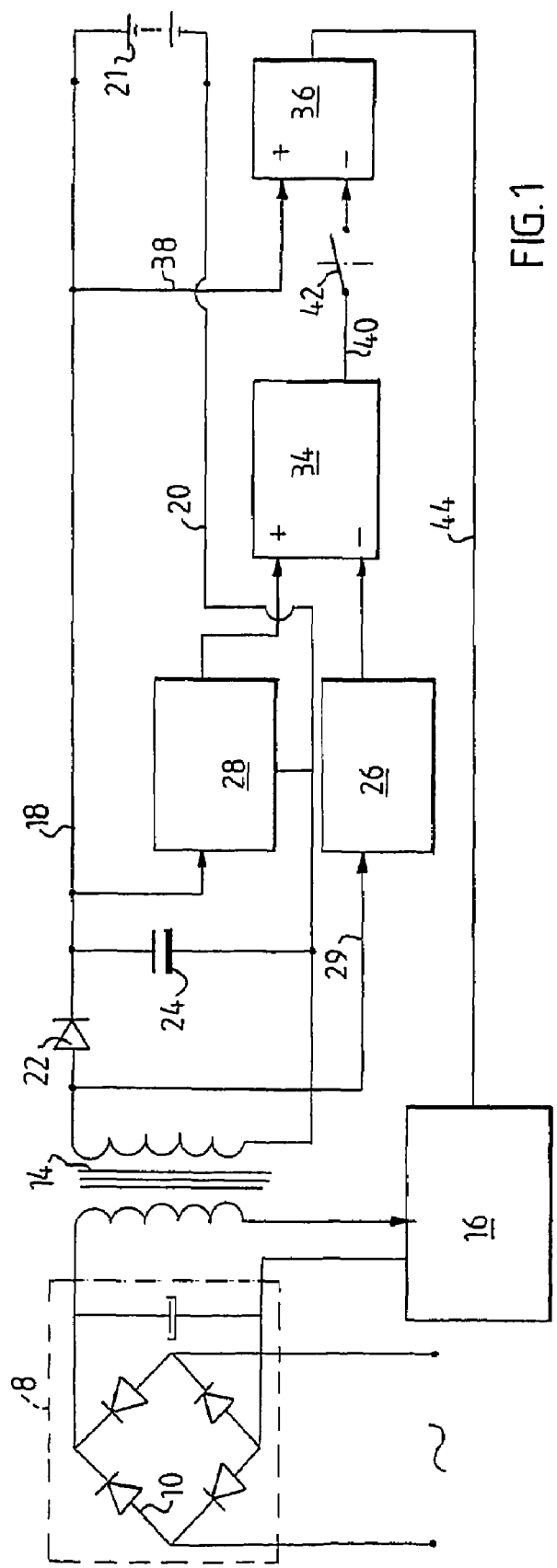

The present invention relates to a device for controlling the current of a battery charger, and in particular a primary switched charger.

BACKGROUND OF THE INVENTION

The charging of batteries should be performed as carefully as possible in order not to damage the battery or reduce its capacity and at the same time the charging should be performed as quickly as possible, these two criteria cannot always be obtained at the same time. In order to shorten the charging time, the charging current can be increased. A high charging current can however damage the battery. To this end the battery manufacturers have strict instructions on how high a charging current is allowed to be as a function of battery size. A normal recommendation is that the charging current is obtained by multiplying the capacity of the battery in ampere hours with 0, 1, ie a 20 Ah battery should be charged with 2 A.

A battery charger is therefore "locked" in a window between being too small, with long charging time, and too large, with detrimental influence on the battery life. As a consequence of this, users with a number of different battery sizes are forced to have a number of different battery chargers, alternatively they charge outside the recommendations of the manufacturers. For all charging of batteries, the final charging voltage has a large impact on the life of the battery. A too high voltage means that the battery develops gas with an increased concentration of sulphuric acid and accelerated grid corrosion as a consequence. A too low voltage means an uncompleted charging with partial sulphating and lost battery capacity as a consequence. A third parameter is that current ripple shall be kept low as it cause an increase in the battery temperature during charging with a decreased life as a consequence.

On linear chargers, ie chargers arranged with a transformer that converts the mains voltage to charging voltage, which are the predominant type for chargers, the current may be controlled in that the transformer is provided with several primary windings and the output voltage is varied by choice of primary winding. Due to this, the output voltage is altered and because the current is proportional to the voltage, the current can be affected. The drawback with this type is apparent on an unregulated linear charger because the voltage to the battery can rise to levels which are detrimental to the battery if quick charging is required and a too low voltage level if it is desired to reduce the current. Ripple is something undesirable on a charger due to the above mentioned problems. The development trend regarding battery chargers is a transfer to primary switched devices, which offer a more exact control of voltage and current and at the same time smaller dimensions. There exists today, as far as the inventors are aware, no changeable output currents on primary switched chargers.

BRIEF DESCRIPTION OF THE INVENTION

The aim of the present invention is to provide a primary switched charger where the user can choose one or more current levels. Because of this, charging parameters can be adapted in order to provide the right treatment of the battery and one single charger can be adequately used for different types and sizes of batteries.

According to one aspect of the invention it discloses a device for reducing the output current of a primary switched battery charger, which charger comprises an input DC power circuit, a high frequency transformer and a control unit for modulating the DC input power, characterised in that it comprises means for measuring pulse ratio of switch pulses on the output side of the charger, means for measuring peak value of output voltage, means for differentially amplifying the signals measured and means for integrating voltage/current of the differentially amplified signals, wherein the integrated voltage/current is used for modulating the input DC power in order to reduce the output current.

According to second aspect of the invention, a device for reducing the output current of a primary switched battery charger is disclosed. The device for reducing the output current of a primary switched battery charger according the second aspect of the present invention comprises an input DC power circuit, a high frequency transformer and a control unit for modulating the DC input power, characterised in that it comprises means for measuring the output effect of the charger; means for measuring the output voltage of the charger; means for dividing the signals measured; and means for multiplexing voltage/current of the output from the means for dividing, wherein the multiplexed voltage/current is used for modulating the input DC power in order to reduce the output current.

According to a third aspect of the invention, there is provided a method for reducing the output current of a primary switched battery charger, which charger comprises an input DC power circuit, a high frequency transformer and control unit for modulating the DC input power. The method is characterised in that it comprises the steps of: measuring the output effect of the charger; measuring the output voltage of the charger; dividing the signals measured; and multiplexing voltage/current of the output from the means for dividing, wherein the multiplexed voltage/current is used for modulating the input DC power in order to reduce the output current.

According to a fourth aspect of the invention, a method for reducing the output current of a primary switched battery charger, which charger comprises an input DC power circuit, a high frequency transformer and a control unit for modulating the DC input power is disclosed. The method is characterised by the steps of: measuring pulse ratio of switch pulses on the output side of the charger; measuring peak value of output voltage; differentially amplifying the signals measured; integrating voltage/current of the differentially amplified signals, wherein the integrated voltage/current is used for modulating the input DC power in order to reduce the output current.

According to a further aspect of the invention there is provided Computer readable medium comprising instructions for bringing a programmable device to perform the method according to the third aspect of the invention or the fourth aspect of the invention.

The advantage with the present invention is that the design provides a good possibility to reduce the charging current to the battery on the output side and is at the same time very cost efficient. A current limitation is possible to perform in the interval of around 5% to 30% of the maximum current. The current regulation will partly be reciprocally proportional to increased load, ie the charging current decreases with increased load. Maximum current is therefore obtained just before the voltage regulation cuts in during reduced load.

These and other aspects of, and advantages with, the present invention will become apparent from the detailed description of the invention and from the accompanying drawings.

SHORT DESCRIPTION OF THE DRAWINGS

Figure 2:
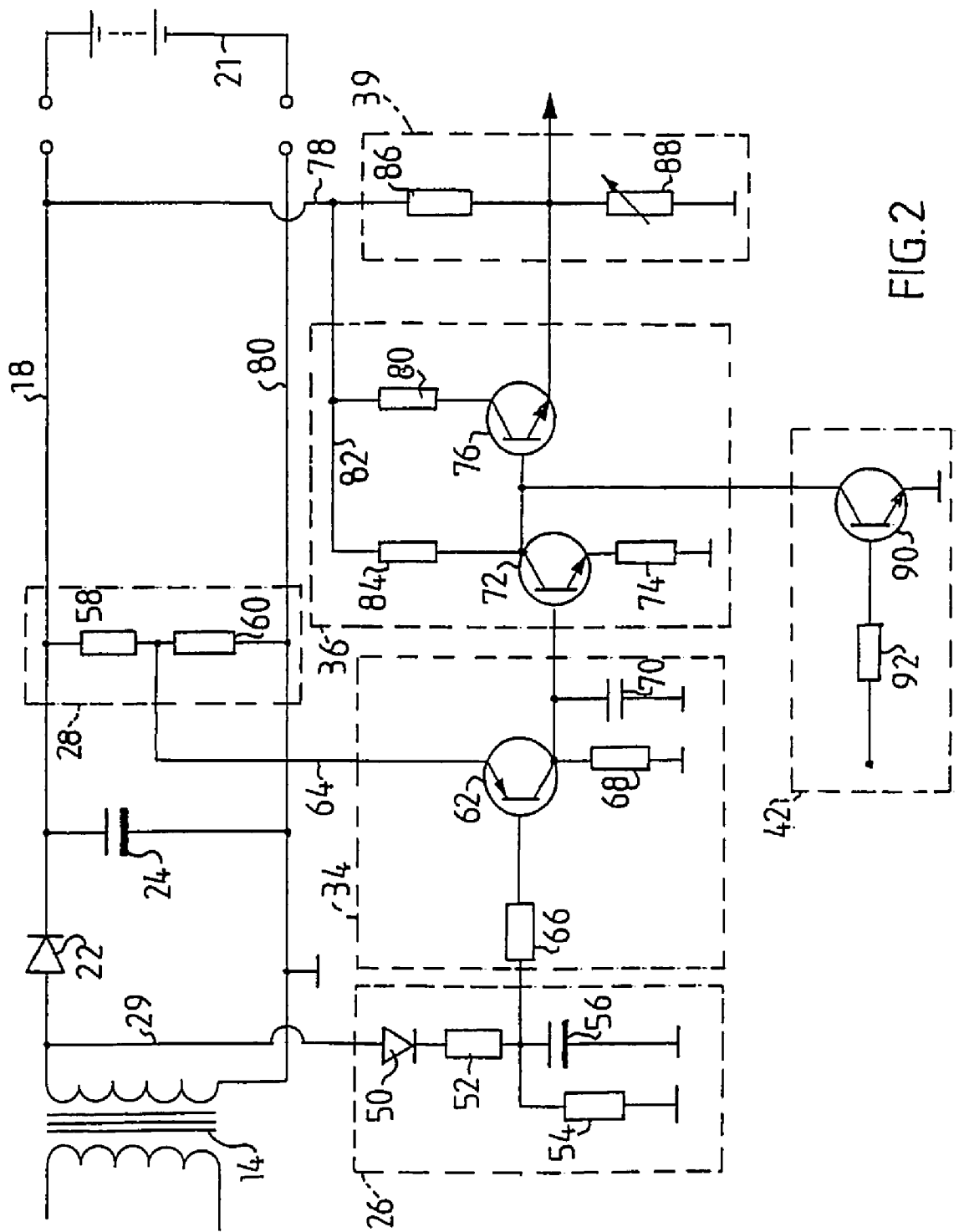
Figure 3:
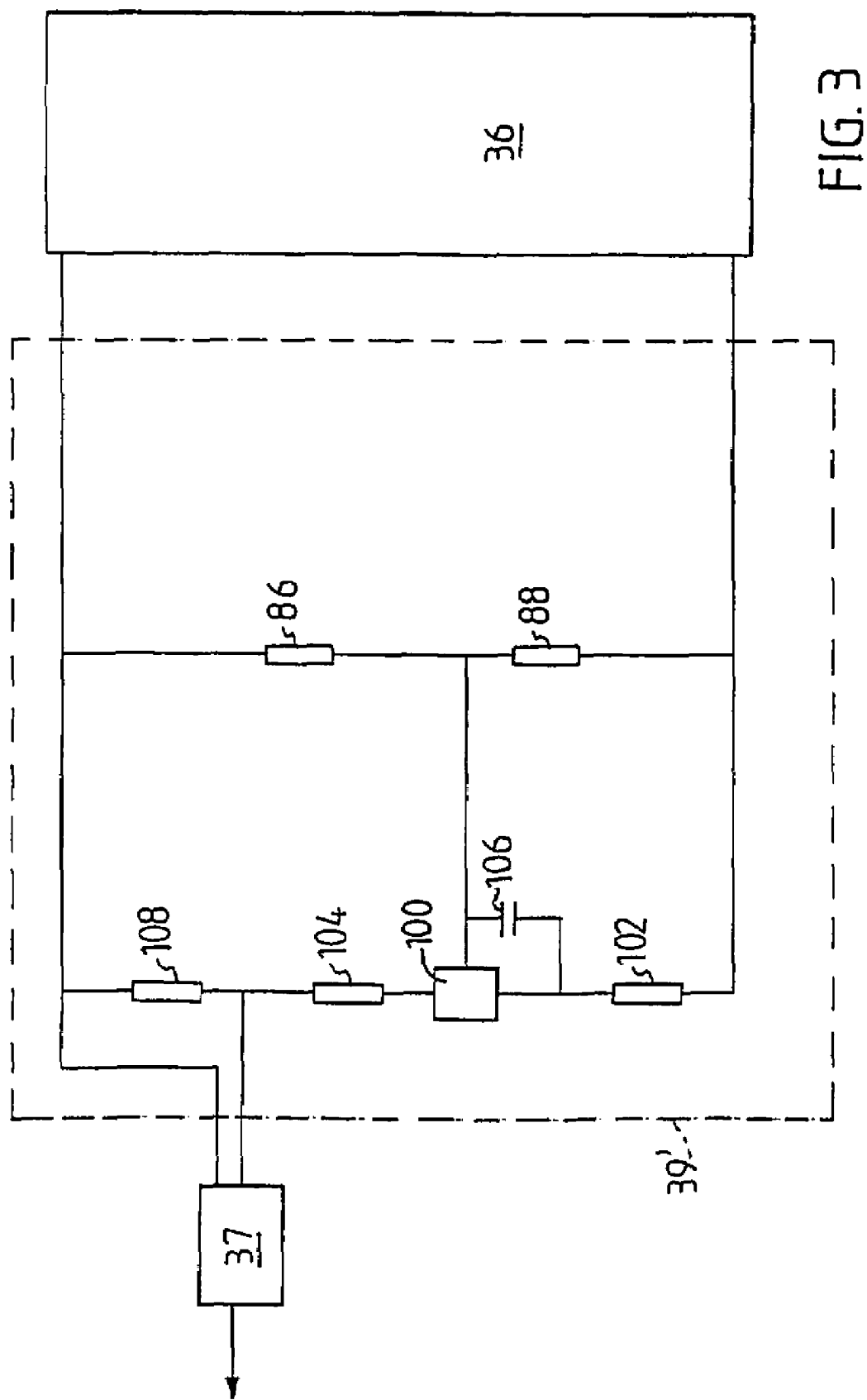
Figure 4:
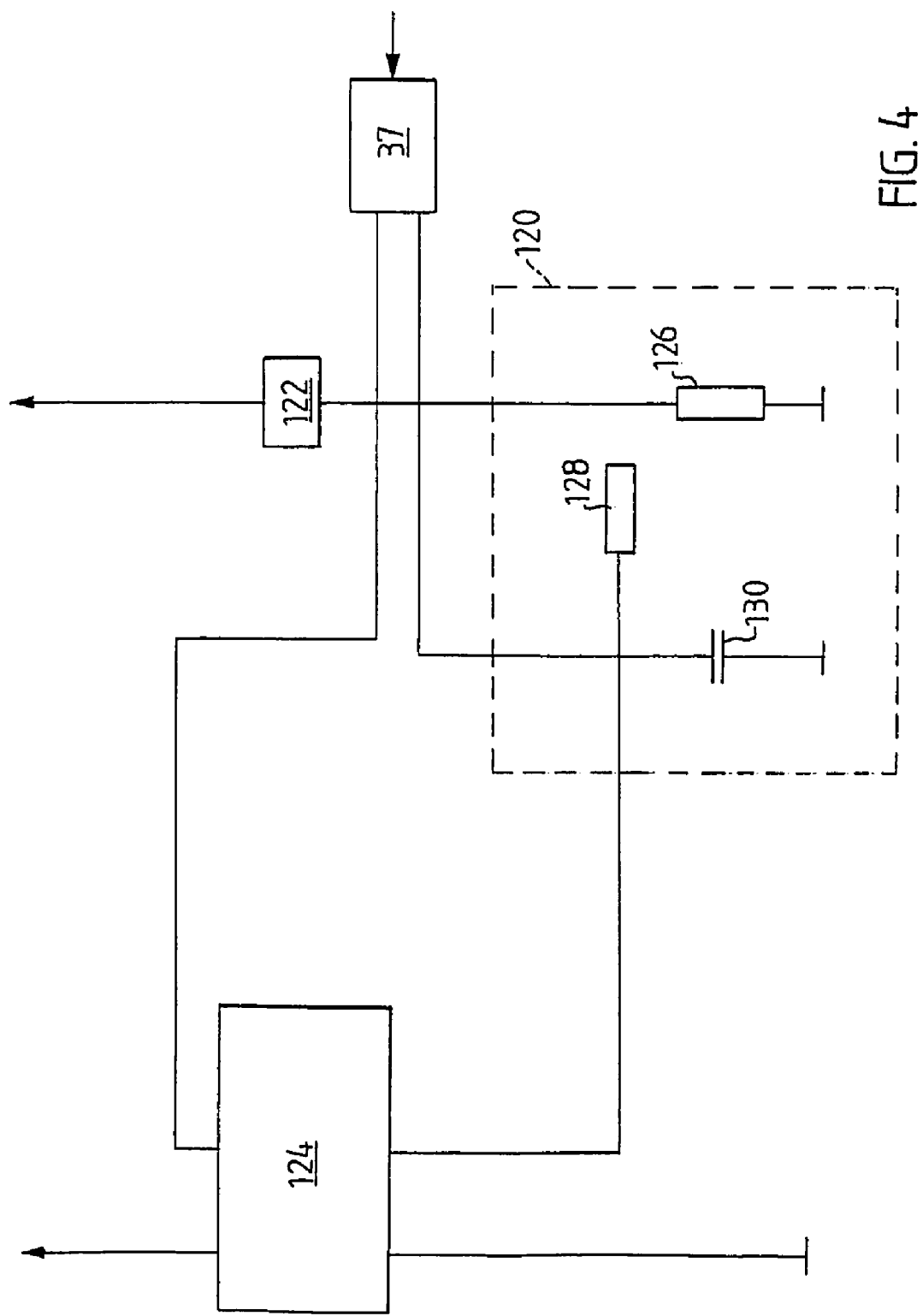

In the following description of the invention, reference will be made to the following drawings, of which FIG. 1 shows a circuit configuration of a battery charger comprising the current device according to the present invention, FIG. 2 shows a block diagram of the current device of the present invention, FIG. 3 shows a more detailed illustration of the effect regulation circuitry shown in FIG. 2, and FIG. 4 shows a circuit configuration of the control unit of FIG. 1.

DETAILED DESCRIPTION OF THE INVENTION

The battery charger shown in FIG. 1 is a primary switched charger comprising in a known manner a DC power circuit 8 connectable to the mains, a diode bridge 10, a smoothing capacitor 12 and a high frequency transformer 14 having a primary winding 14a connected to the DC power circuit 8 and a secondary winding 14b. The smoothing capacitor stores energy as a high DC voltage. The transformer transforms the high voltage to a charging voltage. A control unit 16 comprising, inter alia, an electronic switch, like a field effect transistor FET, is arranged to the DC power circuit and the transformer capable of chopping up the DC power from the DC power circuit into pulses, and controlling and modulating the signal. Furthermore, the control unit 16 comprises modulation circuitry arranged for the modulation of the signal. In FIG. 4 a circuit configuration of the control unit 16 will be shown.

On the output side of the high frequency transformer 14 are two lines, positive 18 and negative 20, provided with means to connect to a battery 21. A rectifying element 22, such as a diode, is arranged to the positive line, and a smoothing capacitor 24 is arranged between the positive and negative line.

The device according to the invention for providing a low current comprises a circuit 26 for measuring the pulse ratio of switch pulses on the output side of the high frequency transformer 14, connected via a line 28 to the positive line 18. The pulse ratio is the ratio between the pulse duration and the interval between two consecutive pulses and is a measure of the output effect of the battery charger at a given output voltage. Accordingly, the circuit 26 in fact measures the output effect of the battery charger. It further comprises a circuit 28 for measuring peak values of the output voltage, connected between the positive and the negative lines. Since the output voltage is a DC voltage which may comprise superimposed voltage components, the circuit 28 for measuring the peak values preferably is arranged to measure the effective values of the output voltage. Output signals from the pulse ratio circuit 26 and the peak value circuit 28 are fed via lines 30, 32 to a differential amplifier 34 for the peak values/pulse ratios arranged to compare the peak value voltage and the pulse ratio voltage and differentially amplifying the resulting value. Preferably, the amplifier 34 is arranged to reverse output signal.

An integrating amplifier 36 for feed-back of voltage/current is arranged with an input line 38 from the positive line 18. A second input line 40 provided with a breaker 42 is provided from the amplifier 34 for activating/deactivating a low-current area. A feed-back line 44 is provided from the integrating amplifier 36 to the control unit 16 to be used for PWM. Preferably, an isolating element (see FIG. 3) is arranged at the feed-back line 44 between the integrating amplifier 36, for example, an optical-coupler or a transformer.

FIG. 2 shows a block diagram of the components of the different circuitry comprised in the present invention.

Furthermore, the pulse ratio circuit 26 comprises a diode 50 connected to line 28 and a resistor 52 in series with the diode. The resistor is in turn connected to a second resistor 54 and a capacitor 56 arranged in parallel with each other and connected to earth.

The peak value circuit 28 comprises two resistors 58 and 60 connected in series with each other and between the positive line 18 and the negative line 20.

The amplifier 34 comprises a transistor 62 where its emitter is connected via line 64 between the resistors 58, 60 of the peak value circuit 28. The base of the transistor 62 is connected via a resistor between the resistor 52 and the resistor/capacitor 54, 56 of the pulse ratio circuit 26. Further, the collector of the transistor 62 is connected to a resistor 68 and a capacitor 70 arranged in parallel with each other and connected to earth.

The integrating amplifier 36 comprises a transistor 72, where its base is connected to the collector of the transistor 62. The emitter of the transistor 72 is connected to earth via a resistor 74. The collector of the transistor 72 is connected to the base of a second transistor 76. The collector of the second transistor 76 is connected to the positive line 18 via a line 78 and a resistor 80. A further line 82 is arranged between the line 78 and the collector of the first transistor 72, which line is arranged with a resistor 84.

Preferably, an optical-coupler 37 (see FIG. 3) is arranged at the feed-back 44 between the integrating amplifier 36 and the control unit 16 to performs the transfer of the feed-back signal from the integrating amplifier 36 at the secondary side to the primary side. The optical-coupler 37 comprises, inter alia, a LED (not shown).

Furthermore, the integrating amplifier 36 is connected to effect regulation circuitry, which is indicated by the dashed box 39, comprising a resistor 86 and a resistance adjusting means 88 and regulation circuitry (see FIG. 3). Of course, there are a number of ways of implementing a resistance adjusting means as the man skilled in the art realizes, for example, by means of a trimming potentiometer. The resistor 86 is connected to the line 78 and to the emitter of the second transistor 76. In turn, the trimming potentiometer 88 is connected between the connection of the resistor 86 and the emitter of the second transistor 76 and earth. The feed-back line 44 is connected to the connection between the resistor 86 and the trimming potentiometer 88. The output voltage is determined by the voltage division between the resistor 86 and the trimming potentiometer 88. Accordingly, the output voltage can be adjusted by an operator by changing the resistance value of the trimming potentiometer 88.

The breaker 42 for activating/deactivating the low-current area comprises a transistor 90 with its collector connected between the collector the first transistor 72 and the base of the second transistor 76 of the integrating amplifier 36. The emitter of the transmitter 90 is connected to earth. The base is via a resistor 92 connected to an electronic switch so that the low-current area of the charging can be chosen by an operator. The skilled man realizes that there are a number of ways to implement a breaker and that the embodiment shown is intended only as an example.

Turning now to FIG. 3, a more detailed illustration of the effect regulation circuitry of FIG. 2 is shown. The regulation circuitry 39 comprises a regulator 100, which preferably is an integrated shunt regulator. The shunt regulator 100 is connected to the resistor 86, the amplifier 36 (or in fact, the emitter of the transistor 76), the trimming potentiometer 88, a second resistor 102 and a third resistor 104. Furthermore a capacitor 106 is connected to a connection between the shunt regulator 100 and the second resistor 102 and to a connection between the resistor 86 and the trimming potentiometer 88. The third resistor 104 is in turn connected to the optical-coupler 37 and to a fourth resistor 108. The resistance values of the second, third and fourth resistors 102, 104 and 108 are carefully selected in order to adapt the feed-back qualities of the regulating circuitry.

Referring now to FIG. 4, a circuit configuration of the control unit of FIG. 1 will be shown. The control unit 16 comprises an effect limiting circuit 120, an electronic switch 122, like a field effect transistor FET, and a modulation circuit 124. Furthermore, the effect limiting circuit 120 includes a first resistor 126 connected to the electronic switch 122 and to earth and a second resistor 128 connected to the first resistor 126, to the optical-coupler 37 and to the modulation circuit. A capacitor 130 is arranged in parallel with the first resistor 126 and connected to earth. The details of the modulation circuitry will not be described in detail here, because it do not form part of the present invention and its function and design is well known to the man skilled in the art. Preferably, the signal is modulated using pulse width modulation (PWM). Of course, the present invention can be used with a number of other modulation methods, for example, pulse-position modulation (PPM) or pulse frequency modulation (PFM). In such cases, any necessary modifications of the circuits of the current device of the present invention in order to adapt the current device to the modulation method used are easily performed by the skilled man and are therefore not described herein.

In function, the device according to present invention operates as follows. The output voltage of the battery charger is measured and divided to a level suitable for the amplifier 34 in the peak value circuit 28. The peak value is used to compensate the measurement of the pulse ratio. Of course, other values are possible to use as, for example, the effective value. At an increased charging current, the output voltage of the charger will decrease.

In the pulse ratio circuit 26, the pulse ratio, i.e. the ratio between the duration of the pulse and the period of time between two consecutive pulses, is measured and, in addition, the pulses are rectified. The voltage at the capacitor 56 increases as the output effect of the charger increases.

Then, the pulse ratio voltage and the peak value voltage is compared in the amplifier 34, the pulse ratio is subtracted from the peak value and the resulting value is amplified. Thus, the amplifier can be seen as a dividing circuit. Preferably, the output signal is inverted in the amplifier 34. This is advantageous in order to achieve a correct start up since the current will increase at a slow rate, i.e. a soft start is obtained. A decreased pulse ratio entails an increased output signal, i.e. an increased voltage at the capacitor 70.

In the integrating amplifier 36 the present output voltage is integrated with the output signal from the amplifier 34, or, in fact, the present output voltage is added to the output signal from the amplifier 34. Thus, the integrating amplifier 36 can be seen as multiplexing circuit. An increased input signal, i.e. an increased input voltage, received from the amplifier 34, at the base of the first transistor 72, corresponds to a decreased output current, which entails that the resistor 84 gradually will be disconnected. This, in turn, leads to an increased output voltage of the charger and, thereby, an increased output current, i.e. charging current.

The regulation of the output voltage of the charger is effected by means of an active limitation of the output effect of the charger. As mentioned above, the output voltage is determined by the ration between the resistance values of the resistor 86 and the trimming potentiometer 88. In effect, the voltage of the cathode of the regulator 100 will be self-regulated so that the voltage at the control input of the regulator will set to approximately 2.5 V. If the output voltage of the charger increases, the regulator 100 will draw a larger current through the cathode. Thereby, the current through the third resistor 104 is increased. This increased current leads to an activation of the LED of the optical-coupler 37, which, in turn, decreases the output effect of the charger.

The transfer of the feed-back signal from the integrating amplifier 36 of the current device, arranged at the secondary side of the charger, to the effect limiting circuit 120 arranged in the control unit 16 at the primary side is performed, as mentioned above, by means of an optical-coupler 37.

In the effect limiting circuit 120, the current through the electronic switch 122 and the high-frequency transformer 14 is measured with, for example, a primary shunt circuit (not shown). At a given current level, which mainly is determined by the resistance of the first resistor 126, the pulse at the control input of the electronic switch 122 is disabled or interrupted. Consequently, the maximal allowed output effect of the charger is determined by means of the resistance value of the first resistor 126. Furthermore, the signal, i.e. the pulse, is filtered by the second resistor 128 and the capacitor 130 in order to remove undesired disturbance peaks in the signal. By adding the voltage at the capacitor 130 via the optical-coupler 37 and the feed-back from the voltage/current control of the secondary side, the output effect of the battery charger can be adjust at each point of time and, thereby, the desired charging voltage or current can be obtained.

As mentioned above, in this preferred embodiment, the modulation circuitry 124 utilizes pulse width modulation. The modulation circuitry controls the control input of the electronic switch 122 with a given fundamental frequency of the pulse operation. The fall of the pulse occur when the voltage has reached a certain level. The period of time between the operating and fall of the pulse determines the duration of the pulse and accordingly the magnetic energy stored in the primary winding of the high-frequency transformer 14 at each pulse. During the duration between to consecutive pulses, the stored energy is transferred to the secondary side of the circuit via the secondary winding of the high-frequency transformer 14 (i.e. a Fly-Back converter). Preferably, a fundamental frequency of approximately 50 kHz is used. Of course, the current device according to the present invention can be used with other types of converters, for example, a forward-converter, as well as, with other frequencies.

The design according to the invention provides a good possibility to reduce the charging current to the battery on the output side and is at the same time very cost efficient. A current limitation is possible to perform in the interval of around 5% to 30% of the maximum current. The current regulation will partly be reciprocally proportional to increased load, ie the charging current decreases with increased load. Maximum current is therefore obtained just before the voltage regulation cuts in during reduced load.

Although specific embodiments have been shown and described herein for purposes of illustration and exemplification, it is understood by those of ordinary skill in the art that the specific embodiments shown and described may be substituted for a wide variety of alternative and/or equivalent implementations without departing from the scope of the present invention. This application is intended to cover any adaptations or variations of the preferred embodiments discussed herein. Consequently, the present invention is defined by the wording of the appended claims and equivalents thereof.

As an example, many of the functions described above may be obtained and carried out by suitable software comprised in a micro-chip, an ASIC, or the like data carrier.

The invention claimed is:

1. Device for reducing the output current of a primary switched battery charger, which charger comprises an input DC power circuit, a high frequency transformer and a control unit for modulating the DC input power, said device comprising:
   a pulse measuring unit for measuring a pulse ratio of switch pulses on the output side of the charger;
   a peak measuring unit for measuring a peak value of an output voltage of the charger;
   a differential amplifying unit providing an output signal by differentially amplifying the measured pulse ratio of switch pulses from the pulse measuring unit and the measured peak value of the output voltage from the peak measuring unit; and
   an amplifier for adding the output voltage of the charger to the output signal from said differential amplifying unit,
   wherein the device is adapted to transmit the output signal from said amplifier to said control unit for use in modulating the input DC power in order to reduce the output current of the charger.

2. Device according to claim 1, characterised in a switch capable of switching on and off a connection between said amplifying unit and said amplifier.

3. Device according to claim 1, wherein,
   the pulse measuring unit comprises connections for for connection to the output side of the high frequency transformer of the charger, the measured pulse ratio is a ratio between a pulse duration and an interval between two consecutive pulses and is a measure of output effect of the charger at a given output voltage,
   the peak measuring unit comprises connections between positive and the negative lines of the charger,
   the differential amplifying unit connected to outputs of the pulse measuring unit and the peak measuring unit to receive the measured pulse ratio of switch pulses from the pulse measuring unit and the measured peak value of the output voltage from the peak measuring unit,
   the amplifier connected to receive the output signal from the differential amplifying unit and the output voltage of the charger,
   an output of the amplifier connected to said control unit by a feedback line, the amplifier transmitting the output signal from the amplifier to said control unit via said feedback line for use in modulating the input DC power in order to reduce the output current of the charger.

4. Method for reducing the output current of a primary switched battery charger, which charger comprises an input DC power circuit, a high frequency transformer and a control unit for modulating the DC input power, the method comprising the steps of:
   measuring a pulse ratio of switch pulses on the output side of the charger;
   measuring a peak value of an output voltage of the charger;
   differentially amplifying the measured pulse ratio of switch pulses and the measured peak value of the output voltage to obtain a differential amplification output signal;
   adding the output voltage of the charger to the obtained differential amplification output signal to obtain a control signal; and
   transmitting the control signal to the control unit for use in modulating the input DC power in order to reduce the output current of the charger.

5. A combination, comprising:
   a primary switched battery charger, said charger comprising an input DC power circuit, a high frequency transformer, and a control unit for modulating the DC input power; and
   a device for reducing an output current of the primary switched battery charger, said device comprising
   i) a pulse measuring unit connected to the output side of the charger to measure a pulse ratio of switch pulses on the output side of the charger;
   ii) a peak measuring unit connected to the output side of the charger to measure a peak value of an output voltage of the charger;
   iii) a differential amplifying unit connected to output sides of the pulse measuring unit and peak measuring unit to provide an output signal by differentially amplifying the measured pulse ratio of switch pulses from the pulse measuring unit and the measured peak value of the output voltage from the peak measuring unit; and
   iv) an amplifier connected to the output signal of the differential amplifying unit and to the output side of the charger and adding the output voltage of the charger to the output signal from said differential amplifying unit, the amplifier having an output connected to said control unit,
   wherein the amplifier transmits the output signal from the amplifier to said control unit, said control unit using the output signal from said amplifier in modulating the input DC power in order to reduce the output current of the charger.

* * * * *